United States Patent [19]

Ogawa

[11] Patent Number: 4,792,920

[45] Date of Patent: Dec. 20, 1988

[54] INTERFACE PROVIDING IMPEDANCE MATCHING BY SELECTIVE CONNECTION OF A RESISTOR ARRAY TO A POWER SUPPLY

[75] Inventor: Tetsu Ogawa, Hanazono, Japan

[73] Assignee: Canon Denshi Kabushiki Kaisha, Chichibu, Japan

[21] Appl. No.: 38,708

[22] Filed: Apr. 15, 1987

Related U.S. Application Data

[63] Continuation of Ser. No. 617,823, Jun. 5, 1984, Pat. No. 4,694,421.

[30] Foreign Application Priority Data

Jun. 29, 1983 [JP] Japan ................. 58-101250

[51] Int. Cl.⁴ ............................................. G06F 13/00
[52] U.S. Cl. ....................................... 364/900; 307/31
[58] Field of Search ... 364/200 MS File, 900 MS File; 357/74; 307/31, 39, 40, 147; 333/22 R, 17 M

[56] References Cited

U.S. PATENT DOCUMENTS

| | | | |
|---|---|---|---|
| 4,219,881 | 8/1980 | Wilske | 364/900 |
| 4,242,720 | 12/1980 | Moore | 361/402 |
| 4,438,347 | 3/1984 | Gehring | 357/74 X |
| 4,694,421 | 9/1987 | Ogawa | 364/900 |
| 4,748,426 | 5/1988 | Stewart | 333/22 R |

Primary Examiner—Raulfe B. Zache
Assistant Examiner—Florin Munteanu
Attorney, Agent, or Firm—Spencer & Frank

[57] ABSTRACT

An interface system having a plurality of signal lines connected between a plurality of input terminals of a control circuit and a plurality of output terminals of a host computer. A plurality of resistor elements each have one end connected to a corresponding one of the plurality of signal lines and the other ends connected in common to a second of a pair of first and second terminals, of which the first terminal is connected to a power source to supply electric power when the terminal pair is short-circuited by a jumper disposed between the first and second terminals. A plurality of diode elements have anodes connected to the second terminal of the terminal pair and cathodes connected to the other ends of the plurality of resistor elements. The resistor elements are electrically interrupted without physically removing the resistor elements by opening the path between the first and second terminals.

3 Claims, 5 Drawing Sheets

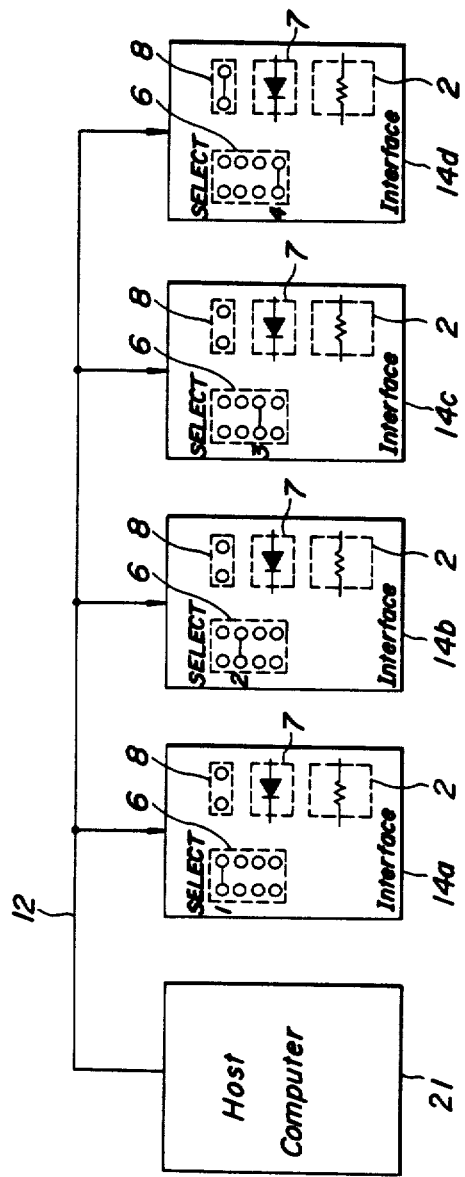

1

INTERFACE PROVIDING IMPEDANCE MATCHING BY SELECTIVE CONNECTION OF A RESISTOR ARRAY TO A POWER SUPPLY

This is a continuation of application Ser. No. 617,823 filed June 5, 1984, now U.S. Pat. No. 4,694,421.

BACKGROUND OF THE INVENTION

1. FIELD OF THE INVENTION

The present invention relates to an interface system for connecting a control circuit to a host computer system by a plurality of signal lines.

2. DESCRIPTION OF THE PRIOR ART

In a magnetic disc system using a floppy disc, for example, a known interface system has a wiring arrangement as shown in FIGS. 1 and 2. In FIG. 1 illustrating a radial chain drive system, interface circuits 4a–4d are connected to a host computer 1 through individual signal cables 11a–11d which correspond respectively to a set of signals from the host computer 1 to the respective interface circuits.

In FIG. 2 illustrating a parallel drive system, a set of signals from a host computer 1 are supplied commonly through a single signal cable 12 to a plurality of interface circuits 14a–14d each having a select jumper connector 6 having jumper terminals SELECT 1–SELECT 4, and selectively drive these interfaces in accordance with a selected terminal of SELECT 1–SELECT 4.

The interface circuits 14a–14d in FIG. 2, which are driven in a parallel fashion, are shown in more detail in FIG. 3. In the figure, the interface circuits 14a–14d are generally designated by reference numeral 14, for the sake of simplicity.

In FIG. 3, the output signals from the host computer 21, for example, known outputs such as $\overline{\text{SELECT 1}}$–$\overline{\text{SELECT 4}}$, $\overline{\text{WRITE DATA}}$, $\overline{\text{WRITE GATE}}$, $\overline{\text{DIRECTION IN}}$, $\overline{\text{STEP}}$, $\overline{\text{MOTOR ON}}$, $\overline{\text{SIDE SELECT}}$, $\overline{\text{HEAD LOAD}}$, are respectively connected to signal lines 9i–9k and 9a–9h, through signal lines 13i–13k and 13a–13h and an interface connector 5. The output signals on the signal lines 9a–9h are supplied to a control unit 3 for controlling a magnetic disc unit 20. The output signals $\overline{\text{SELECT 1}}$–$\overline{\text{SELECT 4}}$ on the signal lines 9i–9k and 9a are respectively connected to the select terminals $\overline{\text{SELECT 1}}$–$\overline{\text{SELECT 4}}$ of the jumper connector 6. The connector 6 of each of the interface circuits 14a–14d has a predetermined connection of the terminals by a shortcircuiting pin, as shown in FIG. 2. This connection allows the host computer 21 to select any of the interface circuits 14a–14d by the signals $\overline{\text{SELECT 1}}$–$\overline{\text{SELECT 4}}$.

To each of the signal lines 9a–9h is connected one terminal of a resistor element 2a–2h respectively a terminal resistor array 2. The other terminals of the resistor elements 2a–2h have a common connection to a power source of +5 V, for example. This connection controls the current in an interface buffer of the host computer 21 and provides impedance matching to reduce a reflecting wave in the interface cable 12.

In the parallel drive system shown in FIG. 2, from the standpoint of impedance matching, the terminal resistor array 2 is connected to only the interface circuit 14d remote from the host computer 21, while the resistor arrays 2 in the remaining interface circuits 14a–14c are removed.

If the resistor elements 2a–2h are used in the circuit arrangement shown in FIG. 3, a signal transmitting through the resistor 2a into the signal line 9a is transmitted into the signal line 9b, since the resistor elements 2a and 2b are connected in series between the signal lines 9a and 9b. Similarly, a signal passing through the signal line 9a also flows through the resistor elements 2a and 2c–2h into the respective signal lines 9c–9h. Therefore, the terminal resistor array 2 must be removed if not necessary, as described above.

To this end, the interface circuits 14a–14d must be so designed as to facilitate an easy removal of the terminal resistor array 2 therefrom.

For this reason, a manufacture of such an interface system delivers the interface systems having the terminal resistor arrays 2 inserted into the socket of each of the ICs containing the interface circuits. When a user uses the interface systems, some of the terminal resistor arrays 2 remain inserted into the IC sockets, as in the interface circuit 14d in FIG. 2, and some of the terminal resistor arrays 2 are removed from the sockets, as in the interface circuits 14a–14c.

As described above, the conventional arrangement needs the IC sockets for detachably connecting the resistor arrays 2. Use of such a socket increases the manufacturing cost. It is required to design the interface systems in such a way that a user can easily remove the terminal resistor array from the socket.

SUMMARY OF THE INVENTION

Accordingly, an object of the present invention is to provide an interface system which is free from the above problems associated with the connection of the terminal resistor array to the interface circuit.

It is another object to provide in an interface system of the present invention wiring in which the resistor array is directly connected to a circuit board, without using any connecting device, such as an IC connector, for the connecting portion of the resistor array, in such a way that the terminal resistor array can be electrically connected to or disconnected from the interface circuit instead of having the terminal resistor array physically connected to or disconnected from the interface circuit.

Other objects, features and advantages of the present invention will be apparent from the following description taken in connection with the accompanying drawings, in which:

BRIEF DESCRIPTION OF THE DRAWINGS

FIG. 5 is a circuit arrangement showing a parallel drive system embodying the interface systems shown in FIG. 4.

DETAILED DESCRIPTION OF THE PREFERRED EMBODIMENTS

Figure 1:
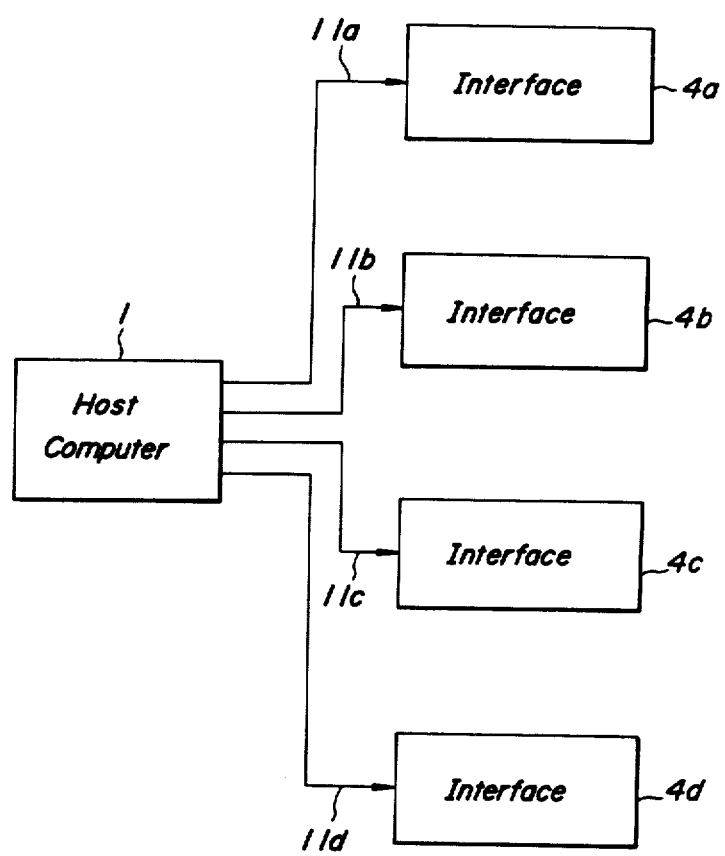
FIG. 1 is a circuit arrangement showing an example of a conventional radial chain drive system.
Figure 2:
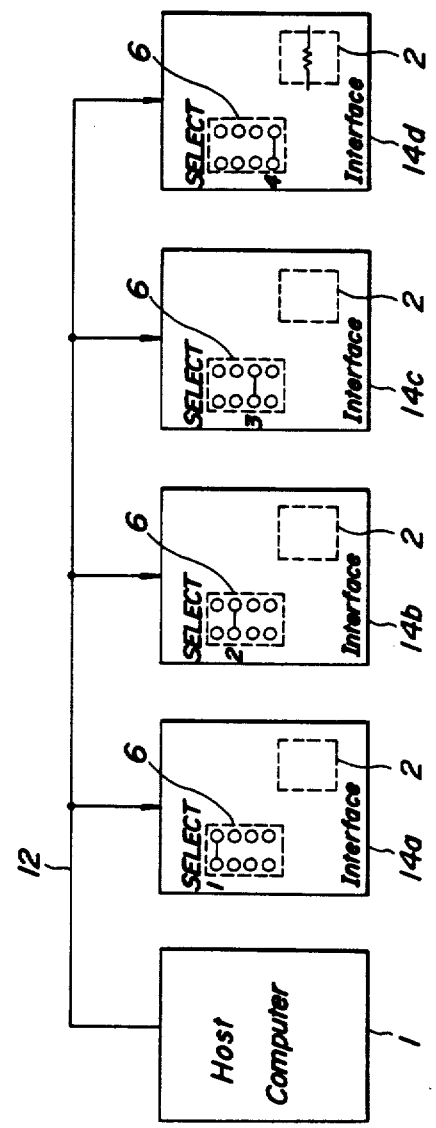
FIG. 2 is a circuit arrangement showing an example of a conventional parallel drive system.
Figure 3:
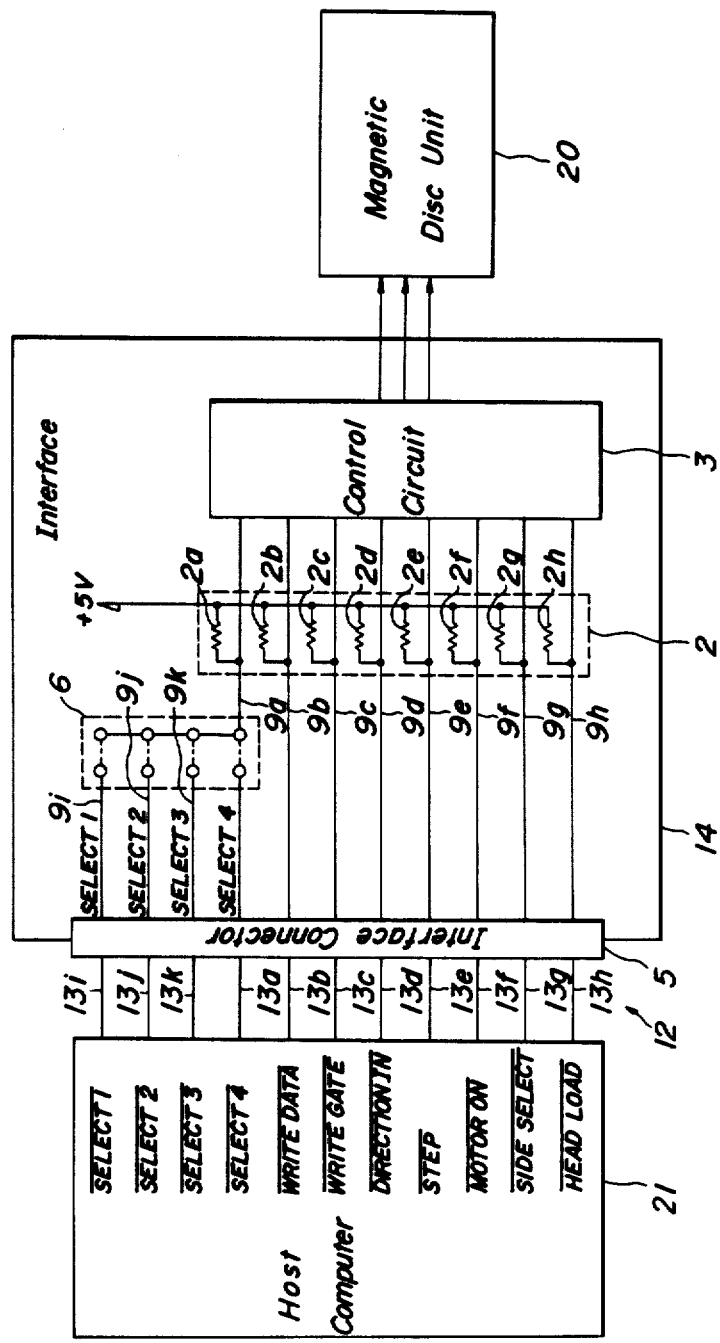
FIG. 3 is a circuit arrangement showing an example of a conventional interface circuit.

An embodiment of an interface system according to the present invention will be described with reference to FIG. 4. The interface system has a diode array 7 (a group of diode elements) containing diode elements 7a–7h and a jumper connector 8 for a terminator. As shown, the terminals of the resistor elements 2a–2h, which are not connected to the signal lines 9a–9h, are respectively connected to the cathodes of the diode elements 7a–7h. The anodes of the diode elements 7a–7h are connected commonly to one terminal 8a of the terminals of the connector 8, of which the other terminal 8b is connected to a power source +5 V. The remaining circuit arrangement of FIG. 4 is the same as the corresponding part of FIG. 3.

When using the terminal resistor array 2, a pair of the terminals 8a and 8b of the jumper connector 8 are short-circuited by a short-circuiting pin 8c, so that a current flows into the resistor elements 2a–2h from the terminal 8b of the jumper connector 8 connected to the power source via the short-circuiting pin, the terminal 8a, and the respective anodes and cathodes of the diode elements 7a–7h. On the other hand, when the terminal resistor array 2 is not used, the short-circuiting pin 8c is removed to open the path between the terminals 8a and 8b.

The jumper connector 8 may be replaced by a switch. When the terminals 8a and 8b are disconnected, a signal passing through the signal line 9a is prevented from passing through the signal lines 9b–9h by the diode elements 7a. Signal-flow into the signal lines 9a–9h are also interrupted in a similar way.

Figure 4:
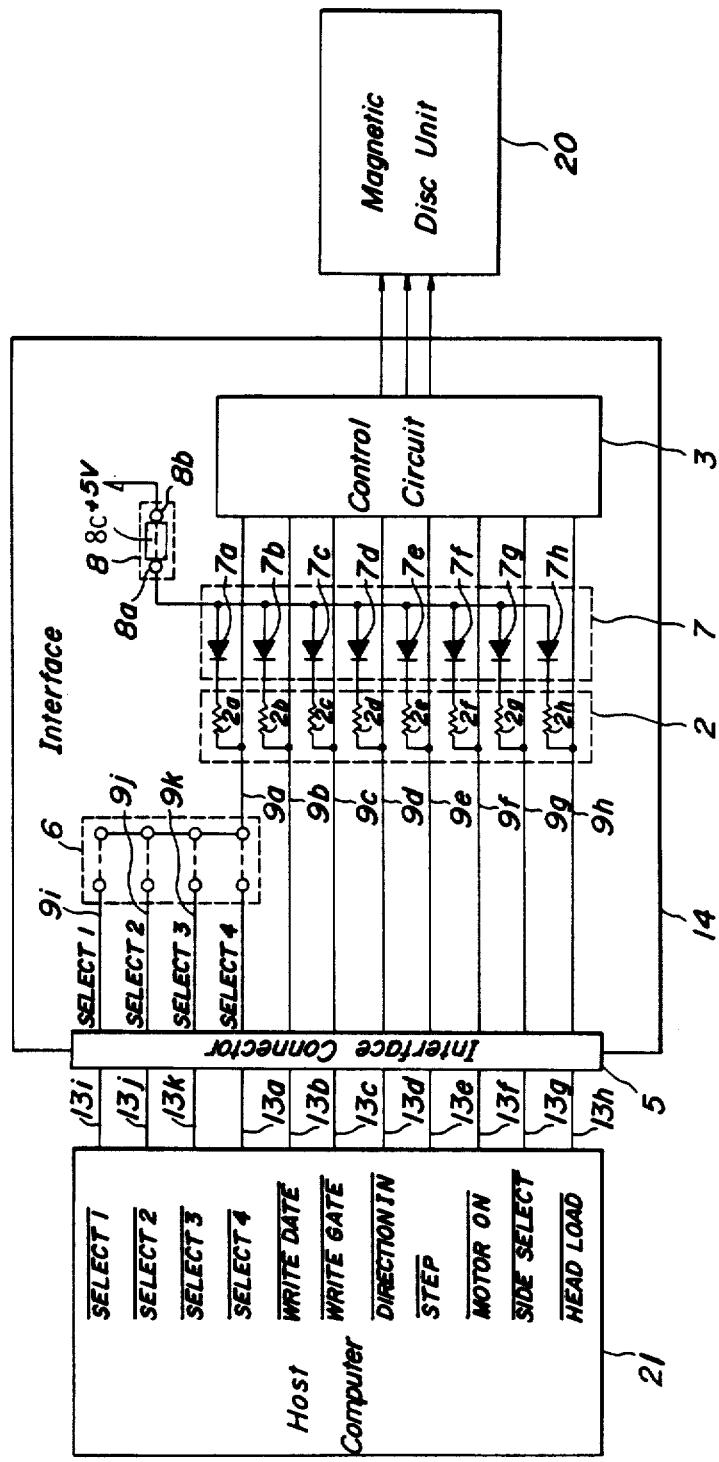
FIG. 4 is a circuit arrangement showing an embodiment of an interface system according to the present invention.

Thus, in case that a parallel drive system incorporates the interface system shown in FIG. 4, as shown in FIG. 5, the drive system does not require the troublesome physical work of installing or removing terminal resistor array 2 in and from the socket which is essential to the prior art system. That is, for the interface circuits 4a–4c which do not require the terminal resistor arrays 2, the jumper connectors 8 are merely opened. For the interface circuit 4d requiring the terminal resistor array 2, the jumper connector 8 is closed.

As seen from the foregoing description, the present invention merely requires the diode array and the jumper connector or the switch, without an expensive IC connector accompanied by troublesome physical work.

When the terminal resistor array is not used, an easy operation of merely removing the short-circuiting pin 8c from the jumper connector or operating the switch is satisfactory. The interface system with such advantageous features reduces the manufacturing cost and provides simple and easy use for users. In designing the interface system according to the present invention, no consideration must be given to the operation of removing the terminal resistor array, because in the interface system, it is not necessary to use a tool for removing the terminal resistor array or a tool for securing a space wide enough to handle the tool. As a result, freedom in selecting a place to install the terminal resistor array is increased. In this respect, flexibility is secured in designing systems using the interface systems. Furthermore, in mounting the interface circuit board in a magnetic disc system, the main planes of the circuit board may be reversed, so that the disc system can have a thinner structure.

What is claimed is:

1. An interface system for connecting a control circuit to a host computer wherein the control circuit has a plurality of input terminals and the host computer has a plurality of output terminals, said interface system comprising:
   a plurality of signal lines, each of said signal lines connecting one of the input terminals of the control circuit to a corresponding one of the output terminals of computer;
   a connector having a first terminal and a second terminal, said first terminal being connected to a power source, said connector including a short circuiting means for selectively connecting said first and second terminals together electrically; and
   a plurality of connection control means for impedance matching of the output of the host computer when said short circuiting means connects said first and second terminals, each of said plurality of connection control means having a first end and a second end, each said first end being connected to a respective one of said plurality of signal lines, each said second end being in electrical connection with said second terminal of said connector for connection to said power source to provide impedance matching for the output of the host computer when said short circuiting means connects said first and second terminals with said power source, said impedance matching not occurring when said short circuiting means does not connect said first and second terminals, each said connection control means including a means for preventing signal interconnection between ones of said plurality of signal lines.

2. An interface system as defined in claim 1, wherein said short circuiting means for selectively connecting said first and second terminals is a short-circuiting pin.

3. An interface system as defined in claim 1, wherein said short circuiting means comprises a switch means.

* * * * *